United States Patent
Feng et al.

(10) Patent No.: US 11,010,507 B2
(45) Date of Patent: May 18, 2021

(54) STRATUM COMPONENT OPTIMIZATION DETERMINATION METHOD AND DEVICE

(71) Applicant: PetroChina Company Limited, Beijing (CN)

(72) Inventors: Zhou Feng, Beijing (CN); Ning Li, Beijing (CN); Hongliang Wu, Beijing (CN); Huafeng Wang, Beijing (CN); Qingfu Feng, Beijing (CN); Kewen Wang, Beijing (CN)

(73) Assignee: Petrochina Company Limited, Beijing (CN)

( * ) Notice: Subject to any disclaimer, the term of this patent is extended or adjusted under 35 U.S.C. 154(b) by 272 days.

(21) Appl. No.: 15/749,290

(22) PCT Filed: Oct. 10, 2016

(86) PCT No.: PCT/CN2016/101643
§ 371 (c)(1),
(2) Date: Jan. 31, 2018

(87) PCT Pub. No.: WO2017/084454
PCT Pub. Date: May 26, 2017

(65) Prior Publication Data
US 2018/0246999 A1 Aug. 30, 2018

(30) Foreign Application Priority Data

Nov. 18, 2015 (CN) .......................... 201510795357.8

(51) Int. Cl.
*E21B 41/00* (2006.01)
*E21B 49/00* (2006.01)
(Continued)

(52) U.S. Cl.
CPC .......... *G06F 30/20* (2020.01); *E21B 41/0092* (2013.01); *E21B 49/00* (2013.01); *E21B 49/02* (2013.01); *G06F 30/00* (2020.01)

(58) Field of Classification Search
CPC ...... G06F 30/20; G06F 30/00; E21B 41/0092; E21B 49/00; E21B 49/02; G01V 99/00
(Continued)

(56) References Cited

U.S. PATENT DOCUMENTS

| 4,903,527 A | 2/1990 | Herron |
| 5,675,147 A | 10/1997 | Ekstrom et al. |
| 2016/0040531 A1* | 2/2016 | Ramakrishnan ......... G01V 1/40 702/8 |

FOREIGN PATENT DOCUMENTS

| CN | 103293563 A | 9/2013 |
| CN | 103375166 A * | 10/2013 |

(Continued)

OTHER PUBLICATIONS

Google Patents, Translation of CN103375166A, Orignial published on Oct. 30, 2013, Accessed on Mar. 10, 2020, 11 pages. (Year: 2013).*

(Continued)

*Primary Examiner* — Kamini S Shah
*Assistant Examiner* — John E Johansen
(74) *Attorney, Agent, or Firm* — Hoffman Warnick LLC

(57) ABSTRACT

The present invention provides a stratum component optimization determination method and device, which fall within the technical field of oil-gas exploration well logging. The method comprises: establishing a stratum rock component model according to core analysis data and geological conditions of a stratum to be detected, and determining a well logging curve determined by a participation model; determining a well logging response equation expression (Continued)

corresponding to the well logging curve determined by the participation model; parsing, recording and storing the well logging response equation expression, establishing a target function of an optimization problem, and solving the target function through an iteration algorithm to determine an optimal component content of the stratum to be detected. By establishing the stratum rock component model, determining corresponding well logging response equation, and parsing through an expression parsing method and recording and storing the well logging response equation expression, and then, establishing the target function of the optimization problem, and obtaining the optimal component content of the stratum to be detected through the iteration algorithm, the present invention can not only optimizes the self-defined well logging response equation expression of the user, but achieves a high processing precision.

10 Claims, 5 Drawing Sheets

(51) Int. Cl.
    *E21B 49/02*     (2006.01)
    *G06F 30/20*     (2020.01)
    *G06F 30/00*     (2020.01)

(58) Field of Classification Search
    USPC .......................................................... 703/10
    See application file for complete search history.

(56) References Cited

FOREIGN PATENT DOCUMENTS

| | | |
|---|---|---|
| CN | 103375166 A | 10/2013 |
| CN | 103617345 A | 3/2014 |
| CN | 105257286 A | 1/2016 |
| CN | 105426612 A | 3/2016 |

OTHER PUBLICATIONS

Tomasso, Mark. "Reservoir Characterization for Geological Static Modeling", Sep. 10, 2010, 54 pages. (Year: 2010).*
Halldorsson et al. "A Modeling Interface to Non-Linear Programming Solvers", Feb. 9, 2000, 14 pages. (Year: 2000).*
Firtch et al. "An integrated and quantitative approach to petrophysical heterogeneity", Marine and Petroleum Geology 63, 2015, pp. 82-96. (Year: 2015).*
European Search Report for Application No. 16865632.0, dated Oct. 23, 2018, 8 pages.
International Search Report and Written Opinion for corresponding PCT No. PCT/CN2016/101643 dated Jan. 3, 2017, 6 pages.
Anonymous, "World Well Logging Technology," China Academic Journal Electronic Publishing House, Dec. 2008, pp. 18-19, retrieved from: http://www.enki.net., English Abstract Provided.
Xiuting et al., "Optimized Logging Evaluation Methods for Carboniferous Reservoir in Tahe Oilfield," Chinese Journal of Engineering Geophysics, vol. 1, Dec. 2004, pp. 513-519, English Abstract provided.
Anonymous, "Natural Gas," Natural Gas Industry, vol. 28, Issue 10, Oct. 2008, pp. 46-48, English Abstract Provided.
Anonymous, "Xinjiang Geology," China Academic Journal Electronic Publishing House, vol. 24, No. 4, Dec. 2006, pp. 441-446, retrieved from: http://www.enki.net., English Abstract Provided.
Ming et al., "The application of genetic algorithm to the logging evaluation of complex reservoir," Journal of Shandong University of Technology (Natural Science Edition), vol. 23, No. 5, Sep. 2009, pp. 83-86, English Abstract Provided.
Chinese Office Action for corresponding Chinese Patent Application No. CN 201510795357.8 dated Jan. 23, 2018, 12 pages.
Chinese Search Report for Chinese Patent Application No. CN 201510795357.8 dated Jan. 23, 2018, 4 pages.
Hou et al., "Well Logging Method in the Analysis of the Mineralogical Composition of Shale Gas Reservoirs," Chinese Journal of Engineering Geophysics, vol. 9, No. 5, Sep. 2012, pp. 607-613.
Zang et al., "Calculation method of porosity based on formation component analysis," Lithologic Reservoirs, vol. 24, No. 1, Feb. 2012, pp. 97-99, 107.

* cited by examiner

STRATUM COMPONENT OPTIMIZATION DETERMINATION METHOD AND DEVICE

This application claims priority to Chinese patent application No. 2015107953578 filed on Nov. 18, 2015 with an invention title "stratum component optimization determining method and device", and the entire content thereof is incorporated by reference herein.

TECHNICAL FIELD

The present invention relates to a stratum component optimization determining method and device, which fall within the technical field of well logging in oil-gas exploration.

BACKGROUND ART

The quantitative determination of stratum component is the basis and key for the reservoir well logging interpretation. By determining mineral and fluid contents of a stratum, and accordingly determining reservoir parameters such as porosity and saturation, it is possible to directly guide the effectiveness of the reservoir, the hydrocarbon reservoir prediction and analysis, and the oil field region evaluation, which are very important to the oil and gas exploration and development.

Currently, the method usually used for determining stratum component content using well logging data is a well logging optimization processing method, which synthesizes all of the well logging information, errors and regional geological experiences into a multi-dimensional information complex, and gets an optimal interpretation result meeting the stratum conditions with mathematical optimization techniques.

Various well logging response equations established according to the stratum model are the basis for the well logging optimization processing method. The well logging response equation represents a quantitative relation between the well logging response and the stratum characteristic parameters, and the degree of coincidence between the optimization processing result and the actual stratum can be determined through the well logging response equation. But in existed optimization processing methods, the well logging response equations usually use several predefined fixed forms. Although these fixed forms provide more model equations to the user during the design as much as possible, the following problems still occur in the practical applications: firstly, the existed well logging response equations are all established based on the classical models, thus their applicable ranges are limited, and the application effects are not ideal in complex reservoirs; secondly, the predetermined model formulas are not applicable in all of the oil fields and stratums, because different regions have their particular forms; and finally, the well logging interpretation usually includes many empirical formulas established according to the rock physical analysis data, while the existed optimization processing methods are not able enough to process those formulas, and their application ranges and processing precisions are restricted.

SUMMARY OF THE DISCLOSURE

In order to solve the problems in the existing well logging optimization processing methods, such as the well logging response equation models are fixed, the applicable ranges are limited, and the processing precisions are poor, the present invention proposes a stratum component optimization determining method and device, which specifically include the following technical solutions:

A stratum component optimization determining method, comprising:

establishing a stratum rock component model according to core analysis data and geological conditions of a stratum to be studied, and determining well logging curves participating in the determination of the model;

determining an expression of the well logging response equation corresponding to the well logging curves participating in the determination of the model;

parsing, recording and storing the expression of the well logging response equation;

establishing a target function of an optimization problem according to the parsed response equation expression, and solving the target function through an iteration algorithm to determine an optimal component content of the stratum to be studied.

In the stratum component optimization determining method of the present invention, the well logging curves comprise at least one of a natural gamma well logging curve, a deep lateral resistivity well logging curve, a shallow lateral resistivity well logging curve, a density well logging curve, a neutron well logging curve or an element capture energy spectrum well logging curve.

In the stratum component optimization determining method of the present invention, the well logging response equation is:

$$t_{ci}=f_i(\vec{v})$$

wherein $t_{ci}$ denotes a value of the well logging response equation; $\vec{v}$ denotes the content of the mineral and fluid component in the stratum to be studied; $f_i(\vec{v})$ denotes an expression form of the well logging response equation, including the variables, constants, operators and parameter symbols of stratum mineral and fluid component.

In the stratum component optimization determining method of the present invention, parsing, recording and storing the well logging response equation expression comprises:

parsing the expression of the well logging response equation, and translating into a postfix expression that can be used for calculation in computer;

recording and storing each element in the postfix expression using a dynamic array storage structure through a data structure;

traversing the storage structures of the postfix expression, determining combination relations between each element in a derivation rule, and determining partial derivative forms of the postfix expression.

In the stratum component optimization determining method of the present invention, the target function of the optimization problem comprises is:

$$v^* = \arg\min\{F(\vec{v})\}$$

$$F(\vec{v}) = \frac{1}{2}\sum_{i=1}^{n}[(t_{ci}-t_{mi})\cdot w_i]^2$$

wherein $F(\vec{v})$ denotes the target function; $v^*$ denotes a value that makes the target function to be a minimum value; $t_{ci}$ denotes a value of response equation each well logging method determined according to the well logging response equation; $t_{mi}$ denotes an actual well logging measured response value; $w_i$ denotes a weight coefficient of the well logging curve in an optimization model; and n denotes the number of well logging curves solved.

In the stratum component optimization determining method of the present invention, the stratum rock component model further comprises an additional constraint condition:

$$h_k(\vec{v}) = C_k \cdot \vec{v} - b_k \leq 0$$

wherein, $h_k(\vec{v})$ denotes a constraint condition; $C_k$ denotes a coefficient matrix of the constraint condition; $\vec{v}$ denotes the content of the stratum mineral and fluid component in the stratum to be studied; $b_k$ denotes a constraint condition boundary.

In the stratum component optimization determining method of the present invention, solving the target function through an iteration algorithm comprises: converting the target function into an expression of the unconstrained problem using a penalty function method:

$$\min \Phi(\vec{v}, M) = F(\vec{v}) + M \cdot P(\vec{v})$$

wherein M denotes a penalty factor;

$$P(\vec{v}) = \sum_{k=1}^{cn} [\max(0, h_k(\vec{v}))]^2$$

denotes a penalty function, wherein when $\vec{v}$ satisfies a constraint condition $h_k(\vec{v}) \leq 0$, a penalty term $M \cdot P(\vec{v}) = 0$, and when $\vec{v}$ does not satisfy the constraint condition $h_k(\vec{v}) \leq 0$, the penalty term $M \cdot P(\vec{v}) > 0$ and increases with the increase of M; cn denotes the number of the constraint conditions.

In the stratum component optimization determining method of the present invention, solving the target function through an iteration algorithm further comprises: determining an iteration increment through a Levenberg-Marquardt algorithm as follows:

$$(J^T J + \mu \cdot I) \cdot h = -J^T R$$

wherein J denotes a Jacobi matrix of R; I denotes a unit matrix; and µ denotes a damping factor, $$R = \begin{bmatrix} (t_{ci} - t_{mi}) \cdot w_i \\ (g_k - b_k) \cdot \alpha_k \end{bmatrix}.$$

In the stratum component optimization determining method of the present invention, solving the target function through an iteration algorithm further comprises:

performing a first iteration on a group of initially set stratum component content values for a each processed depth point, plugging each stratum component content value into a partial derivative expression parsed and stored to obtain a matrix J;

acquiring a current iteration increment according to the iteration increment, and turning to a next iteration;

obtaining an optimal stratum component content by solving when an iteration stratum component value satisfies a precision requirement and the additional constraint condition.

A stratum component optimization determining device, comprising:

a well logging curve determining unit configured to establish a stratum rock component model according to core analysis data and geological conditions of a stratum to be studied, and determine well logging curves participating in the determination of the model;

a response equation determining unit configured to determine an expression of the well logging response equation corresponding to the well logging curves participating in the determination of the model;

a parsing unit configured to parse, record and store the expression of the well logging response equation;

an optimal content determining unit configured to establish a target function of an optimization problem according to the parsed response equation expression, and solve the target function through an iteration algorithm to determine an optimal component content of the stratum to be studied.

The embodiments of the present disclosure provide a stratum component optimization determining device, wherein comprising a memory, a processor and a computer program stored in the memory and executable on the processor, the processor performs the following operations when executing the computer program:

establishing a stratum rock component model according to core analysis data and geological conditions of a stratum to be studied, and determining well logging curves participating in the determination of the model;

determining an expression of the well logging response equation corresponding to the well logging curves participating in the determination of the model;

parsing, recording and storing the expression of the well logging response equation;

establishing a target function of an optimization problem according to the parsed response equation expression, and solving the target function through an iteration algorithm to determine an optimal component content of the stratum to be studied.

The embodiments of the present disclosure further provide a computer readable storage medium, wherein the computer readable storage medium stores a computer program which causes the processor to perform the following operations when being executed:

establishing a stratum rock component model according to core analysis data and geological conditions of a stratum to be studied, and determining well logging curves participating in the determination of the model;

determining an expression of the well logging response equation corresponding to the well logging curves participating in the determination of the model;

parsing, recording and storing the expression of the well logging response equation;

establishing a target function of an optimization problem according to the parsed response equation expression, and solving the target function through an iteration algorithm to determine an optimal component content of the stratum to be studied.

The present invention has the following advantages: by establishing the stratum rock component model, determining corresponding well logging response equation, parsing through an expression parsing method and recording and storing the well logging response equation expression, and then, establishing the target function of the optimization problem, and obtaining the optimal component content of the stratum to be studied through the iteration algorithm, the present invention can not only optimizes with the user-defined well logging response equation expression within a wide applicable range, but achieves a high processing precision.

DETAILED DESCRIPTION OF THE PREFERRED EMBODIMENTS

Figure 1:
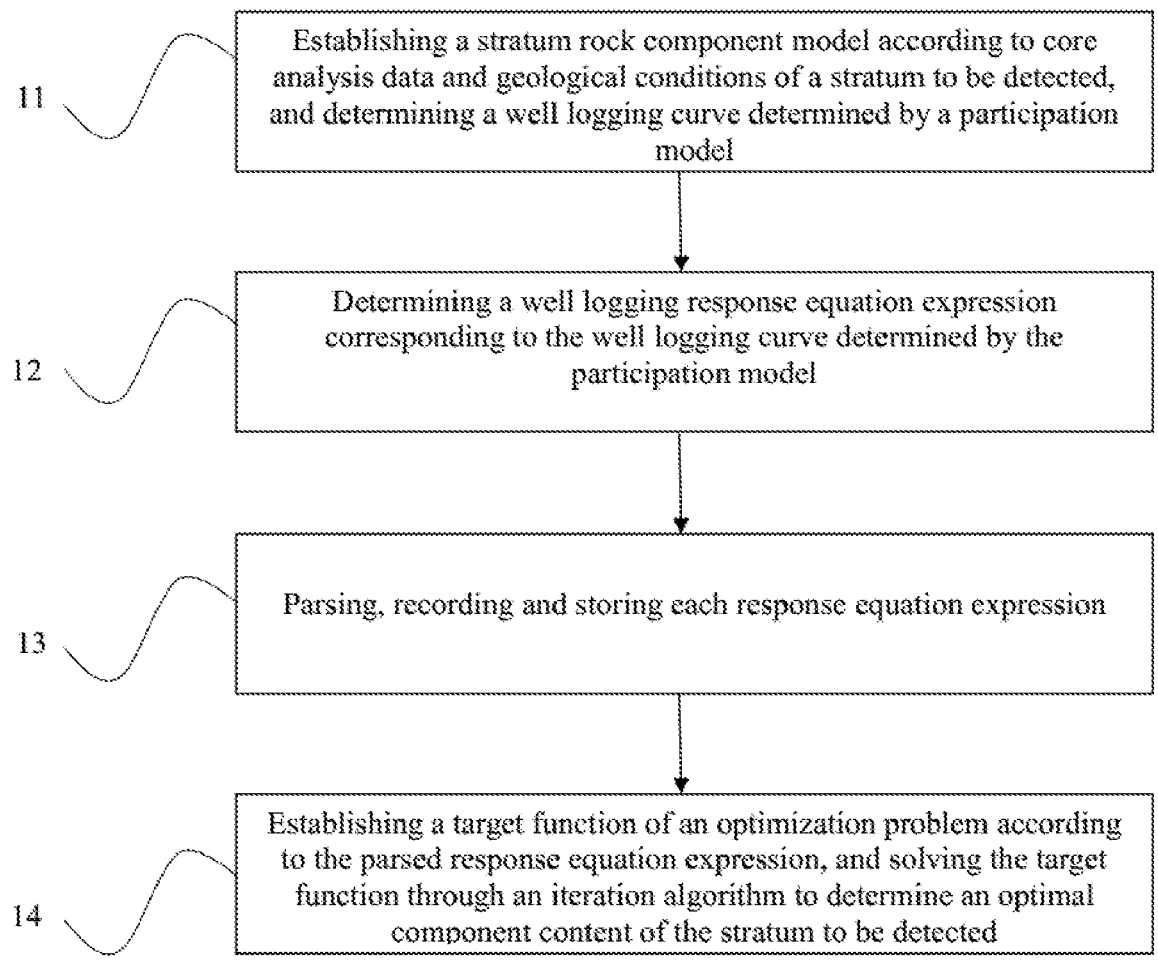
FIG. 1 illustrates a flow diagram of a stratum component optimization determining method with an example.

As illustrated in FIG. 1, a stratum component optimization determining method provided by this embodiment comprises:

Step 11: establishing a stratum rock component model according to core analysis data and geological conditions of a stratum to be studied, and determining well logging curves participating in the determination of the model.

As to a predetermined stratum to be studied, acquirable well logging data and experimental analysis data comprises: the conventional and electrical imaging well logging data of the stratum to be studied, and core and fluid experimental analysis data. The main mineral types, trace mineral types and stratum fluid types of the rock in the stratum to be studied can be determined according to the core and fluid analysis data and the geological conditions. Then a stratum rock component model for a well logging interpretation can be established.

The change rule of the well logging curves of the layers or sections to be processed are observed to select curves obviously responsive to the change of mineral or fluid in the stratum to be used in the model optimization processing, and it is ensured that the number of the curves participating in the determination is larger than the number of components of mineral and fluid in the model as much as possible.

Step 12: determining an expression of the well logging response equation corresponding to the well logging curves participating in the determination of the model.

An optimal response equation and parameter value of each well logging method for the layer or section to be processed are selected according to the reservoir section core experimental data fitting or studied block regional experiences. This response equation shall describe, in a high precision, the change rule of corresponding well logging curve in response to the mineral and fluid components in the studied stratum.

Step 13: parsing, recording and storing each response equation expression.

The well logging response equation expression of each well logging method is parsed, separated and stored using a dynamic expression parsing method, and then a partial derivative form of the well logging response equation expression is obtained through a partial derivative parsing. In the parsing process, just by traversing each storage structure, and determining the combination relations between the elements in a derivation rule according to the types of operators of the elements, the partial derivative forms of the expression for various variables can be formed and orderly recorded with predetermined storage structures. Regarding the recorded postfix expressions and partial derivative expressions, variables and parameters are plugged therein to orderly traversing each storage structure, and directly obtain values of corresponding expressions in a postfix expression rule.

Step 14: establishing a target function of an optimization problem according to the parsed response equation expression, and solving the target function through an iteration algorithm to determine an optimal component content of the stratum to be studied.

Optionally, according to the each optimal well logging response equation expression of well logging method in the studied stratum, the target function of the optimization problem can be established using a least square method.

The target function of the optimization problem established using the least square method can be converted into an unconstrained problem through a penalty function, and then an optimization solution can be gained through a Levenberg-Marquardt method.

In which, in each depth of the studied stratum, the Levenberg-Marquardt algorithm firstly gives a group of initially set stratum component content values to perform a first iteration, plugs the result into the partial derivative expression, which parsed and recorded in step 13, to obtain the partial derivative matrix, then acquires a current iteration increment and turns to a next iteration, until each stratum component content value in the studied stratum satisfies the precision requirement and predetermined constraint conditional expressions, then an optimal stratum component content can be gained.

Next, the stratum component optimization determining method will be described in details through specific embodiments.

Embodiment 1

Figure 2:
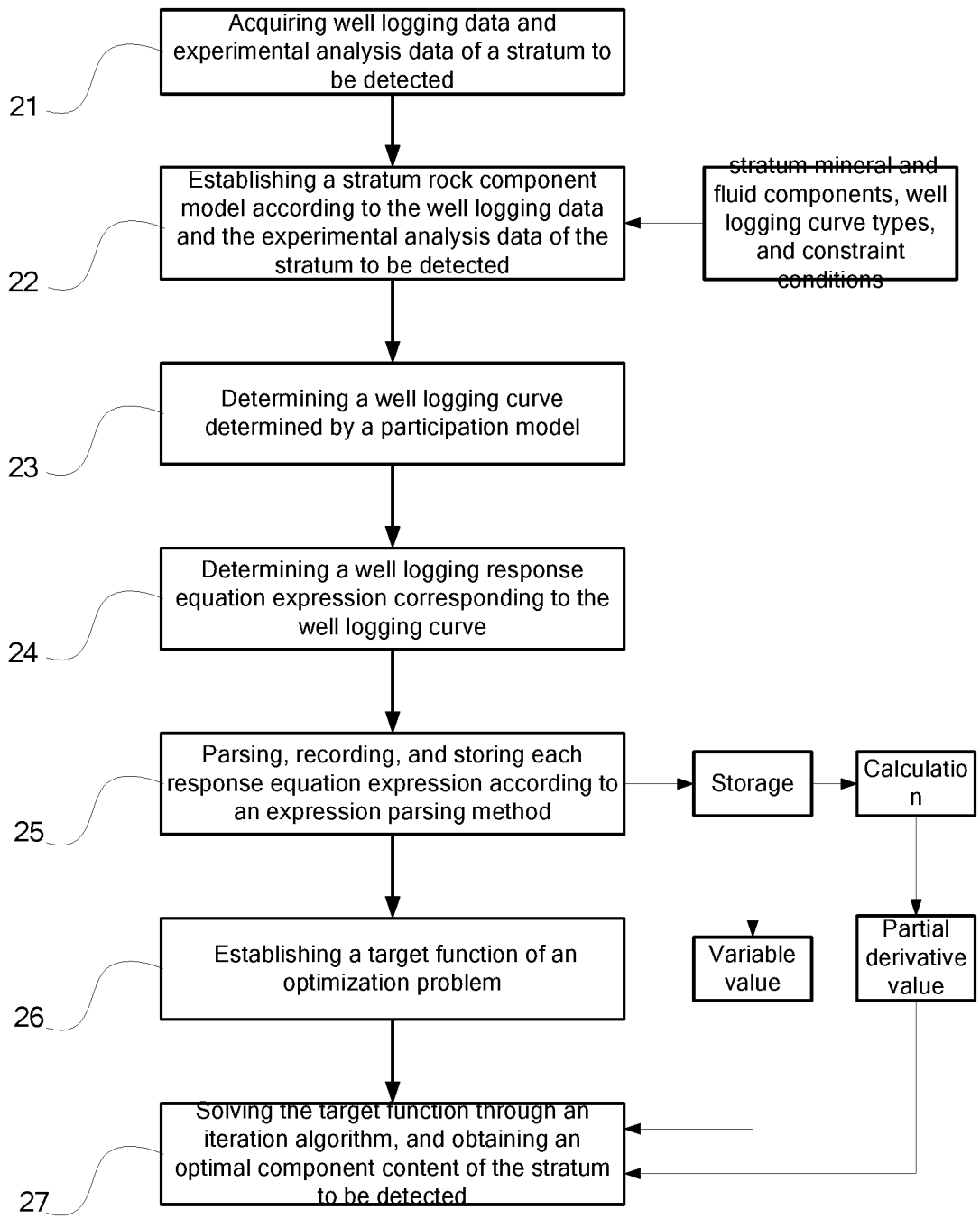
FIG. 2 illustrates a flow diagram of a stratum component optimization determining method provided by Embodiment 1.

As illustrated in FIG. 2, a stratum component optimization determining method provided by this embodiment comprises:

step 21: acquiring well logging data and experimental analysis data of a stratum to be studied;

As to a predetermined stratum to be studied, acquirable well logging data and experimental analysis data comprises: conventional and electrical imaging well logging data of the stratum to be studied, and core and fluid experimental analysis data.

In which, the core experimental analysis may comprise data of different zones and lithologies, so as to acquire the geological conditions of the stratum to be studied. The core experimental analysis data may comprise coring descriptions, physical property analysis data, lithification data, rock electrical properties, nuclear magnetism, acoustic wave, etc. The fluid experimental analysis data may comprise stratum test data, stratum water analysis data, etc. for recognizing the stratum fluid type and the stratum water property.

Step 22: establishing a stratum rock component model according to the well logging data and the experimental analysis data of the stratum to be studied.

For example, in well A data processing for a certain oil and gas field, the 6050.0-6090.0 m interval of the well A belongs to the Permian Changxing Group, where the Changxing Group lithology is mainly limestone in reef reservoir, and partially dolomitized which forms a high quality dolomite reservoir. Next, the 6064.0-6071.5 m interval is in continuous sealed coring, and the cores show that the lithologies of the section are mainly limestone, dolomite limestone, and calcite dolomite. Further lithification analyses show that the stratum mineral types of the well section mainly include calcite and dolomite, the clay mineral content is low, and the porous fluids are composed of stratum water and natural gas. The stratum rock component model established according to the above data may include clay, calcite, dolomite, stratum water and gas.

Optionally, the ranges of the component contents of the minerals and fluid included in the stratum rock component model may be limited with the interpreter's experiences, and used as the additional constraint in the optimization processing.

Step 23: determining well logging curves participating in the determination of the model.

As known by the conventional well logging, the natural gamma well logging curve obviously reflects the clay mineral content change; the density and neutron well logging curves reflect the content changes of dolomite and calcite and the stratum porosity; while the deep and shallow lateral resistivity logging curves reflect the fluid component changes in the pores of the undisturbed stratum and the flushed zone. Thus, for the stratum mineral and fluid types in the stratum rock component model, the well logging curves participating in the determination of the model comprise the natural gamma well logging curve, the deep lateral resistivity well logging curve, the shallow lateral resistivity well logging curve, the density well logging curve and the neutron well logging curve.

Step 24: determining an expression of the well logging response equation corresponding to the well logging curves.

This embodiment establishes the optimal well logging response equation of each well logging method for the stratum to be studied according to the core experimental analysis data fitting of the stratum to be studied. The well logging response equation shall describe, in a high precision, the change rule of corresponding well logging curve in response to the mineral and fluid components of the stratum to be calculated. The general form of the well logging response equation is:

$$t_{ci} = f_i(\vec{V})$$

wherein, $t_{ci}$ denotes a value of the well logging response equation of each well logging method; $\vec{V}$ denotes the content of the mineral and fluid component in the stratum to be studied; $f_i(\vec{V})$ denotes an expression form of the well logging response equation, including the variables, constants, operators and parameter symbols of stratum mineral and fluid component.

Figure 3:
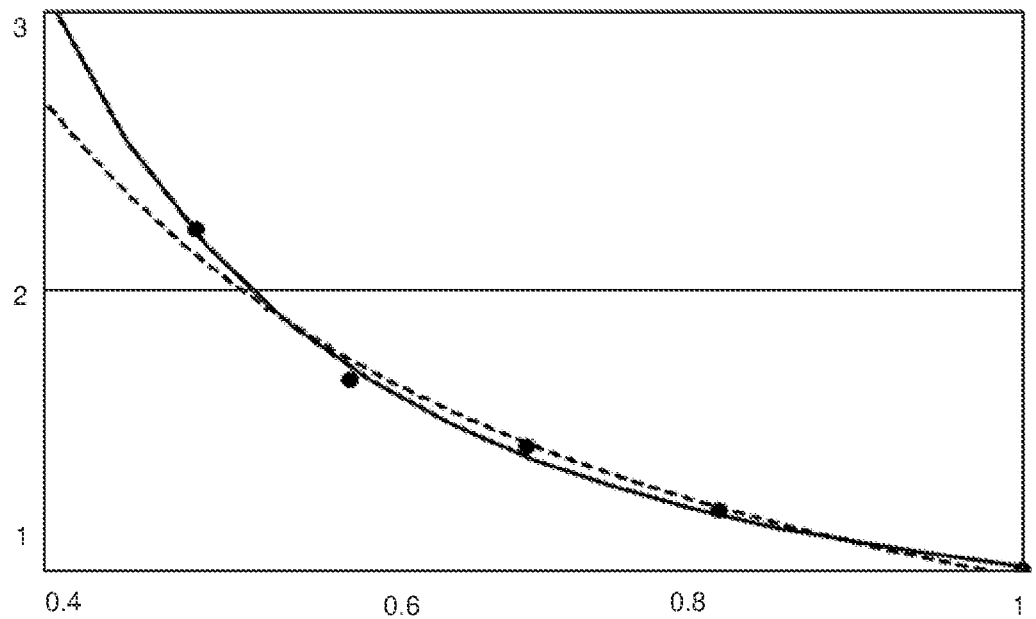
FIG. 3 illustrates a schematic diagram of a measurement result of a typical core water saturation—resistivity index experiment provided by Embodiment 1, wherein a horizontal ordinate indicates a water saturation (Sw), a vertical coordinate indicates a resistivity index (I), a dot indicates a rock electrical property experiment combination, a solid curve indicates fitting structure with an optimal saturation equation, and a dotted curve indicates fitting result with Archie formula.

Next, a determination process of the resistivity well logging response equation is described as an example, and a rock electrical property analysis experiment is also performed for the full diameter cores of the well section. FIG. 3 illustrates a measurement result of a typical core water saturation—resistivity index experiment, and obtains fitting results of the Archie formula and the general form of saturation equation in an optimally simple form. As can be seen from the fitting results, where the water saturation is more than 0.5, the fitting result of the Archie formula is close to that of the optimal saturation equation, while the water saturation is less than 0.5, the fitting result of the Archie formula is obviously different from the measured data, and the fitting result of the optimal saturation equation can accurately reflect the core Sw-I change characteristics. Thus, this embodiment performs processing using the general form of saturation equation which can more accurately reflect the stratum rock electrical property change characteristics.

The optimal saturation equation obtained from the rock electrical property experiment fitting is:

$$I = \frac{0.32494}{S_w^{2.17399}} + 0.69126$$

Thus, the deep lateral resistivity well logging response equation is:

$$t_{crt} = \frac{a \cdot R_w}{\varphi^m} \cdot \left( \frac{1}{p_1 S_w^{n_1}} + p_2 \right)$$

wherein $t_{crt}$ denotes a value of deep lateral resistivity with a unit of OHMM (Ohm meter); a denotes a lithology factor which is valued as 1 herein without a dimension; $R_w$ denotes a stratum water resistivity, which can be obtained directly from stratum water analysis data, with a unit of OHMM; m denotes a stratum cementation index which is valued as 2 herein without a dimension; φ denotes a stratum porosity which is a sum of all fluid components in the stratum with a unit of V/V; $S_w$ denotes a undisturbed stratum water saturation, which is a percentage of stratum water content to the whole porous portion with a unit of V/V; $P_1$, $P_2$ and $n_1$ are all equation parameters which can be determined through predetermined experiments, which are valued as 1/0.32494, 0.69126 and 2.17399 herein, respectively.

Similarly, the shallow lateral resistivity well logging response equation can be determined as:

$$t_{crxo} = \frac{a \cdot R_{mf}}{\varphi^m} \cdot \left( \frac{1}{p_1 S_{xo}^{n_1}} + p_2 \right)$$

wherein $t_{cixo}$ denotes a value of shallow lateral resistivity with a unit of OHMM; a denotes a lithology factor which is valued as 1 herein without a dimension; $R_{mf}$ denotes a mud filtrate resistivity, which can be obtained directly from stratum water analysis data, with a unit of OHMM; m denotes a stratum cementation index which is valued as 2 herein without a dimension; φ denotes a stratum porosity which is a sum of all fluid components in the stratum with a unit of V/V; $S_{xo}$ denotes a flushed zone water saturation, which is a percentage of stratum water content to the whole porous portion with a unit of V/V; $P_1$, $P_2$ and $n_1$ are all equation parameters which can be determined through predetermined experiments, which are valued as 1/0.32494, 0.69126 and 2.17399 herein, respectively.

The deep and shallow lateral resistivity well logging response equations are inputted into the deep and shallow lateral resistivity well logging response equations in the optimization determining method to obtain the following expressions, respectively:

$$t_{crt}=A*RW*(1/(P1*((UWAT+VCLAY*WCLP)/ (UWAT+UGAS+VCLAY*WCLP)^N1))+P2)/ ((UWAT+UGAS+VCLAY*WCLP)^M)$$

$$t_{co}=A*RMF*(1/(P1*((XWAT+VCLAY*WCLP)/ (XWAT+XGAS+VCLAY*WCLP)^N1))+P2)/ ((XWAT+XGAS+VCLAY*WCLP)^M)$$

wherein UWAT and UGAS denote water and gas component contents in the undisturbed stratum, respectively, XWAT and XGAS denote water and gas component contents in the flushed zone, respectively, VCLAY denotes a clay component content, and UWAT, UGAS, XWAT, XGAS and VCLAY are all variable elements in the well logging response equation expression; WCLP denotes a clay-bound water porosity which is a certain parameter for a specific clay type.

Step 25: parsing, recording, and storing each response equation expression according to an expression parsing method.

Figure 4:
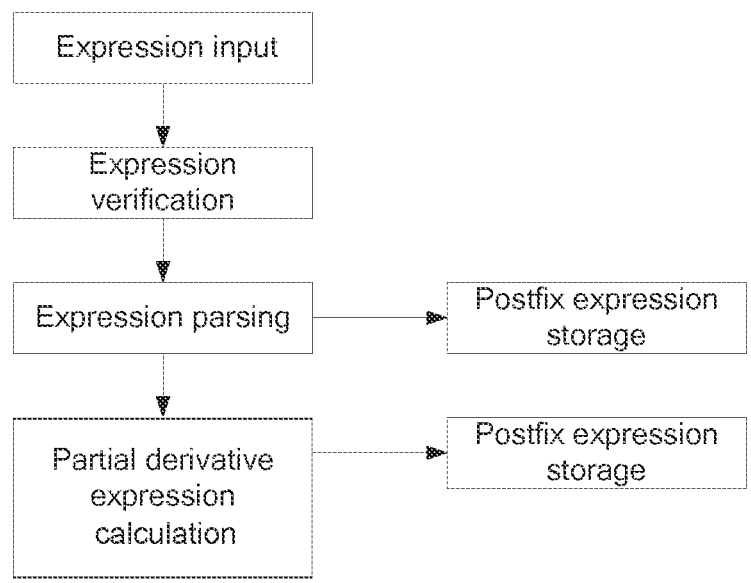
FIG. 4 illustrates a flow diagram of an expression parsing provided by Embodiment 1.

As illustrated in FIG. 4, the expression parsing process includes three stages: 1) expression element analysis; 2) expression separation and storage; 3) partial derivatives calculation and storage of the expression.

On stage 1), the elements such as variables, constants, operators, and parameter symbols included in the expression character string of the well logging response equation established in step 24 are classified and matched to verify whether the expression definition is legal. Once the matching of the elements included in the expression is completed, the syntactic structure of the expression is determined, and the calculation result of the expression is only influenced by the values of the variables and parameters therein.

On stage 2), through the matching and recognition of the elements (constants, parentheses, operators, variables, parameters, etc.) of the expression on stage 1), syntactic analyses are performed for the established well logging response equation expression, including the function of the parentheses, the priority of the operators, the appearance order of the operators, the polysemy exclusion, etc., and at the same time, the above expression is escaped into a postfix expression for computer arithmetic where each element is recorded as a data structure and orderly stored in a dynamic array. The data structure may comprise three fields, wherein the first field is of a character string type (string) to store an expression element; the second field is of a double-precision float type (double) to store a value of the element, wherein a value of a constant is the constant itself, and values of a variable and a parameter are given in subsequent calculations; the third field is of an integer type (int) to identify types of an operator and an operand, wherein a constant is 0, a variable is 2, and a defined operator is 1. The storage structure corresponding to the data structure may be represented as:

| Element 1 | (string) element form |
| | (double) element value |
| | (int) element type |
| Element 2 | (string) element form |
| | (double) element value |
| | (int) element type |
| ... | |
| Element n | (string) element form |
| | (double) element value |
| | (int) element type |

This stage has the advantages that the converted postfix expression avoids the problem of the priority of operations caused by different operators and parentheses positions in the original expression, and simplifies the calculation order; meanwhile, in the subsequent calculations, the expression storage structure only needs to be scanned once, which saves the time cost.

On stage 3), the postfix expression obtained by parsing on stage 2) is used to traverse each storage structure, judge the relations between each element and the variables, determine the combination relations between the elements in a derivation rule according to the operator types, finally obtain partial derivative forms of the expression for various variables, and orderly record them with the structures stored on stage 2).

Next, a deep lateral resistivity well logging response equation expression provided by this embodiment is taken as an example. Firstly, it checks whether an inputted expression is legal by analyzing elements therein through an expression verification. The analysis shows that the deep lateral resistivity response equation expression comprises variables (UWAT, UGAS and VCLAY), constants, parameters (A, RW, P1, P2, N1, M and WCLP), and four-arithmetic operators, parentheses, involution operators, etc. The variables and parameters in the expression are legally used, the operators and parentheses are complete, and the calculation requirement is satisfied. Next, the expression parsing is performed by reading all the characters from left to right, parsing the syntactic structure thereof, and escaping a result thereof into a postfix expression for a storage. The postfix expression stored by the deep lateral resistivity well logging response equation expression is:

$$A\ RW*1P1UWAT\ VCLAY\ WCLP*+UWAT\ UGAS+ \\ VCLAY\ WCLP*+/N1^*/P2+*UWAT\ UGAS+ \\ VCLAY\ WCLP*+M^/$$

The storage structure of the deep lateral resistivity well logging response equation expression may be represented as:

| A | "A" |
| | 0 (given in subsequent calculation) |
| | 0 |
| RW | "RW" |
| | 0 (given in subsequent calculation) |
| | 0 |
| * | "*" |
| | 0 |
| | 1 |
| 1 | "1" |
| | 1.0 |
| | 0 |
| ... | |
| UWAT | "UWAT" |
| | 0 (given in subsequent calculation) |
| | 2 |
| ... | |

Finally, a partial derivative parsing is performed, i.e., the partial derivative form of the expression for each variable can be formed by traversing each storage structure, and determining combination relations between the elements in a derivation rule according to operator types of the elements, and those partial derivative forms are orderly recorded with the storage structures. Regarding each of the stored postfix expressions and partial derivative expressions, the value of corresponding expression can be directly obtained in a postfix expression rule by plugging in the values of the variables and parameters, and orderly traversing each storage structure.

Step 26: Establishing a target function of an optimization problem.

According to the optimal well logging response equation expression of each well logging method for the stratum to be studied, the target function of the optimization problem can be established using a least square method. The optimization target function is established using the least square method according to each well logging response equation expression. The target function established herein is:

$$v^* = \arg\min\{F(\vec{v})\}$$

$$F(\vec{v}) = \frac{1}{2}\sum_{i=1}^{n}[(t_{ci} - t_{mi}) \cdot w_i]^2$$

wherein $F(\vec{v})$ denotes the target function; $v^*$ denotes a value that gives the target function a minimum value; $t_{ci}$ denotes a response equation value of each well logging method determined according to the well logging response equation; $t_{mi}$ denotes an actual well logging measured response value; $w_i$ denotes a weight coefficient of the well logging curve in an optimization model, which can be determined according to a quality of the well logging curve; and n denotes the number of well logging curves solved.

Optionally, each component content in the target function may be limited to a certain range, while satisfying the additional constraint condition in step 22, which is generally represented as:

$$h_k(\vec{v}) = C_k \cdot \vec{v} - b_k \leq 0$$

wherein, $h_k(\vec{v})$ denotes a constraint condition; $C_k$ denotes a constraint condition coefficient matrix; $\vec{v}$ denotes stratum mineral and fluid component contents of the stratum to be studied; $b_k$ denotes a constraint condition boundary.

Optionally, any component in each stratum may further at least satisfy two constraint conditions, namely, the sum of components is 1, or the flushed zone and the undisturbed stratum have the same fluid content, i.e.,

VCALC+VDOLO+VCLAY+UWAT+
 UGAS=1UWAT+UGAS+
 VCLAY*WCLP=XWAT+XGAS+
 VCLAY*WCLP

The optimization problem to be solved is transformed into a condition-constraint non-linear least square problem composed of the above two established target functions and the above two constraint conditions.

Step 27: solving the target function through an iteration algorithm, and obtaining an optimal component content of the stratum to be studied.

Firstly, the condition-constraint non-linear least square problem may be transformed into an expression of an unconstrained problem in a penalty function method:

$$\min \Phi(\vec{v}, M) = F(\vec{v}) + M \cdot P(\vec{v})$$

wherein M denotes a penalty factor;

$$P(\vec{v}) = \sum_{k=1}^{cn}[\max(0, h_k(\vec{v}))]^2$$

denotes a penalty function, wherein when $\vec{v}$ satisfies a constraint condition $h_k(\vec{v}) \leq 0$, a penalty term $M \cdot P(\vec{v}) = 0$, and when $\vec{v}$ does not satisfy the constraint condition $h_k(\vec{v}) \leq 0$, the penalty term $M \cdot P(\vec{v}) > 0$ and increases with the increase of M; cn denotes the number of the constraint conditions.

Next, an iteration increment calculation is performed with the following formula through a Levenberg-Marquardt algorithm:

$$\Phi(\vec{v}, M) = F(\vec{v}) + M \cdot \sum_{k=1}^{cn}[\max(0, h_k(\vec{v}))]^2$$

$$= \frac{1}{2}\sum_{i=1}^{n}[(t_{ci} - t_{mi}) \cdot w_i]^2 + \frac{1}{2}\sum_{k=1}^{cn}[(C_k \cdot \vec{v} - b_k) \cdot \alpha_k]^2$$

$$= \frac{1}{2}R^T R$$

wherein $\alpha_k = \sqrt{2M^*\omega}$; when $h_k(\vec{v}) \leq 0$, $\omega=0$; when $h_k(\vec{v}) > 0$ $\omega=1$.

$$R = \begin{bmatrix} (t_{ci} - t_{mi}) \cdot w_i \\ (g_k - b_k) \cdot \alpha_k \end{bmatrix};$$

The iteration increment achieved through the Levenberg-Marquardt algorithm may be represented as:

$$(J^T J + \mu \cdot I) \cdot h = -J^T R$$

wherein J denotes a Jacobi matrix of R, i.e., $$J = \frac{\partial R}{\partial \vec{v}};$$

I denotes a unit matrix; μ denotes a damping factor, which reflects a difference between the actual decrement and the first-order approximate decrement of the target function at the current iteration point of the target function, and can be adaptively adjusted in the iteration process.

$t_{mi}$ and $b_k$ are both constants irrelevant to the stratum mineral and fluid component contents (for a depth point of each processing), thus, $$J = \frac{\partial R}{\partial \vec{v}} = \begin{bmatrix} \frac{\partial[(t_{ci} - t_{mi}) \cdot w_i]}{\partial \vec{v}} \\ \frac{\partial[(g_k - b_k) \cdot \alpha_k]}{\partial \vec{v}} \end{bmatrix} = \begin{bmatrix} \frac{\partial t_{ci}}{\partial \vec{v}} \cdot w_i \\ \frac{\partial g_k}{\partial \vec{v}} \cdot \alpha_k \end{bmatrix} = \begin{bmatrix} \frac{\partial t_{ci}}{\partial \vec{v}} \cdot w_i \\ C_k \cdot \alpha_k \end{bmatrix}$$

In the above equation, the partial derivative forms of each response equation for various stratum variables have been parsed and stored in step 25, thus for a depth point of each processing, firstly a group of initially set stratum component content values are given (i.e., the variables in the target function of the optimization problem established in step 26; the initial value of a depth point of a first processing may be given randomly, and a depth point of any subsequent processing may take a processing result of its previous depth point as its initial value) to perform a first iteration, and the matrix J can be obtained by plugging each stratum component content value into the partial derivative expressions parsed and stored in step 25; next, a current iteration increment is calculated according to the iteration increment equation, and the flow turns to a next iteration. The optimal stratum component content is obtained when the iteration stratum component value satisfies the precision requirement and the above additional constraint condition. The stratum mineral and fluid component contents can be determined from the optimal stratum component content, so as to directly determine the stratum lithology, which is beneficial to the reservoir development and the fluid properties, thereby guiding the reservoir comprehensive evaluation.

Figure 5:
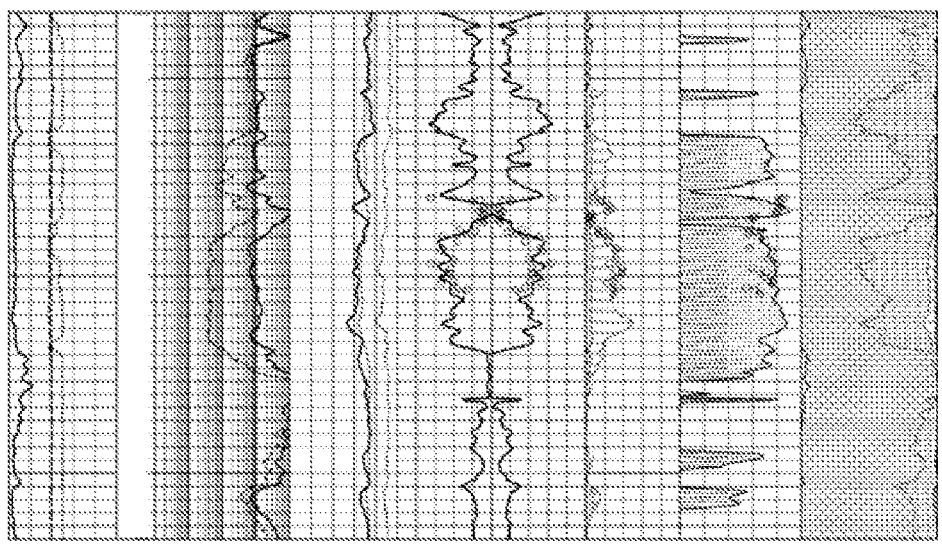
FIG. 5 illustrates a schematic diagram of a comparison between a stratum mineral and fluid component content result of well A provided by Embodiment 1 and an experimental analysis result.

FIG. 5 illustrates a stratum component content results of well A and a comparison with laboratory analysis results. In which, the first column indicates the conventional natural gamma, photoelectric absorption cross-section index and borehole diameter curve; the second column indicates depths; the third column indicates dual lateral resistivity curves; the fourth column indicates tri-porosity curves; the fifth and sixth columns respectively indicate comparisons of calcite and dolomite contents obtained by processing with a core analysis result; the seventh column indicates a total stratum fluid volume obtained by processing, i.e., a comparison of a total porosity with a core analysis porosity; the eighth column indicates a comparison of a gas saturation obtained by processing with a sealed coring result; the ninth column indicates a stratum lithologic section obtained by processing; while in the columns as illustrated in FIG. 5, the dots indicate corresponding core analysis results. As can be seen from FIG. 5, the stratum mineral (e.g., calcite and dolomite) content and the stratum fluid component content obtained by processing in this embodiment all well coincide with the core analysis results, the porosity error is usually less than 0.5% porosity, and the mineral content and saturation deviation is averagely within 10%.

Embodiment 2

Figure 6:
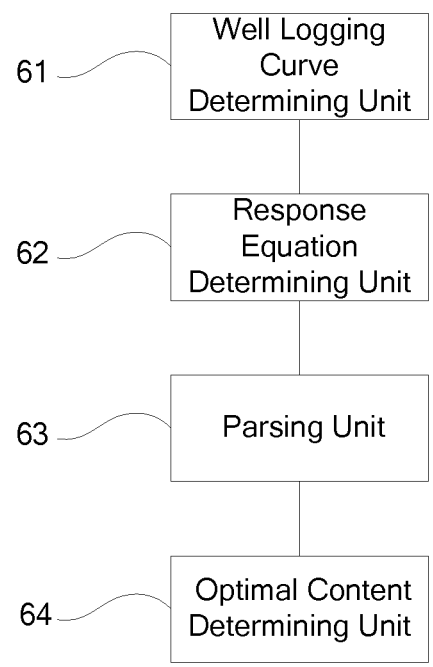
FIG. 6 illustrates a structure diagram of a stratum component optimization determining device provided by Embodiment 2.

As illustrated in FIG. 6, a device for determining the optimization of stratum component provided by this embodiment comprises:

a well logging curve determining unit 61 configured to establish a stratum rock component model according to core analysis data and geological conditions of a stratum to be studied, and determine well logging curves participating in the determination of the model;

a response equation determining unit 62 configured to determine an expression of the well logging response equation corresponding to the well logging curves participating in the determination of the model;

a parsing unit 63 configured to parse, record and store the expression of the well logging response equation;

an optimal content determining unit 64 configured to establish a target function of an optimization problem according to the parsed response equation expression, and solve the target function through an iteration algorithm to determine an optimal component content of the stratum to be studied.

Firstly, the well logging curve determining unit 61 may determine main mineral component types, trace mineral types and stratum fluid types of the rock of the stratum to be studied according to the core and fluid analysis data and the geological conditions, so as to establish a stratum rock component model for a well logging interpretation. Next, the response equation determining unit 62 selects an optimal response equation and parameter value of each well logging method for the layer or section to be processed according to the reservoir section core experimental data fitting or studied block regional experiences. This response equation shall describe, in a high precision, the change rule of corresponding well logging curve in response to the mineral and fluid components of the stratum to be calculated. Next, the parsing unit 63 parses, separates and stores the well logging response equation expression of each well logging method using a dynamic expression parsing method, and then obtains a partial derivative form of the well logging response equation expression through a partial derivative parsing. In the parsing process, just by traversing each storage structure, and determining the combination relations between the elements in a derivation rule according to the types of operators of the elements, the partial derivative forms of the expression for various variables can be formed and orderly recorded with predetermined storage structures. Regarding the stored postfix expressions and partial derivative expressions, variables and parameters are plugged therein to orderly traversing each storage structure, and directly obtain values of corresponding expressions in a postfix expression rule. Finally, the optimal content determining unit 64 converts the target function of the optimization problem established using the least square method into an unconstrained problem through a penalty function, and then performs an optimization solution through a Levenberg-Marquardt. In which, the Levenberg-Marquardt algorithm firstly gives a group of initially set stratum component content values for a depth point of each processing to perform a first iteration, plugs a result into a partial derivative expression recorded, parsed and stored by the parsing unit 63 to obtain the partial derivative matrix, then acquires a current iteration increment and turns to a next iteration, until each stratum component content value of the stratum to be studied satisfies the precision requirement and predetermined constraint conditional expression, thereby solving an optimal stratum component content.

The stratum component optimization determining device provided by this embodiment has the following advantages:

1) by introducing the dynamic expression parsing technique into the well logging optimization processing method, the addition and the optimization processing of the user's self-defined response equation are realized, thereby further improving the applicable range and precision of the optimization processing;

2) the optimization solution is performed by using the Levenberg-Marquardt algorithm in the well logging optimization processing method, thereby achieving a high efficiency and solution precision;

3) a set of complete stratum component optimization determining method and processing flows based on the dynamic expression parsing technique are established, which achieves good application effects in the oil field applications at site, and effectively improves the precision of the stratum mineral and fluid contents.

The embodiments of the present invention further provide a computer readable storage medium for computer readable instructions, and when being executed, the computer readable instructions cause a processor to at least perform the operations of: establishing a stratum rock component model according to core analysis data and geological conditions of a stratum to be studied, and determining well logging curves participating in the determination of the model; determining an expression of the well logging response equation corresponding to the well logging curves participating in the determination of the model; parsing, recording and storing the expression of the well logging response equation; establishing a target function of an optimization problem according to the parsed response equation expression, and solving the target function through an iteration algorithm to determine an optimal component content of the stratum to be studied.

In one embodiment, the computer readable instructions cause the processor to parse expression of the well logging response equation, and translate into a postfix expression that can be used for calculation in computer; record and store each element in the postfix expression using a dynamic array storage structure through a data structure; traverse the storage structures of the postfix expression, determine combination relations between each element in a derivation rule, and determine partial derivative forms of the postfix expression.

In one embodiment, the computer readable instructions cause the processor to convert the target function into an expression of the unconstrained problem using a penalty function method:

$$\min \Phi(\vec{v},M)=F(\vec{v})+M \cdot P(\vec{v})$$

wherein M denotes a penalty factor;

$$P(\vec{v}) = \sum_{K=1}^{cn} [\max(0, h_k(\vec{v}))]^2$$

denotes a penalty function, wherein when $\vec{v}$ satisfies a constraint condition $h_k(\vec{v}) \leq 0$, a penalty term $M \cdot P(\vec{v})=0$, and when $\vec{v}$ does not satisfy the constraint condition $h_k(\vec{v}) \leq 0$, the penalty term $M \cdot P(\vec{v}) > 0$ and increases with the increase of M; cn denotes the number of the constraint conditions.

In one embodiment, the computer readable instructions cause the processor to determine an iteration increment through the Levenberg-Marquardt algorithm as follows:

$$(J^T J + \mu \cdot I) \cdot h = -J^T R$$

wherein J denotes a Jacobi matrix of R; I denotes a unit matrix; and μ denotes a damping factor, $$R = \begin{bmatrix} (t_{ci} - t_{mi}) \cdot w_i \\ (g_k - b_k) \cdot \alpha_k \end{bmatrix}.$$

In one embodiment, the computer readable instructions cause the processor to perform a first iteration on a group of initially set stratum component content values for a each processed depth point, plug each stratum component content value into a partial derivative expression parsed and stored to obtain a matrix J; acquire a current iteration increment according to the iteration increment, and turn to a next iteration; and obtain an optimal stratum component content when an iteration stratum component value satisfies a precision requirement and the additional constraint condition.

Figure 7:
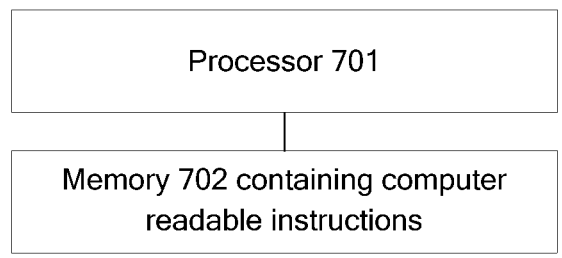
FIG. 7 illustrates an apparatus for acquiring a stratum rock component content provided by an embodiment of the present application.

The embodiments of the present invention further provide an apparatus for acquiring a stratum rock component content. As illustrated in FIG. 7, the apparatus comprises a processor 701; and a memory 702 containing computer readable instructions, the processor performs the following operations when executing the computer program stored in the memory: establishing a stratum rock component model according to core analysis data and geological conditions of a stratum to be studied, and determining well logging curves participating in the determination of the model; determining an expression of the well logging response equation corresponding to the well logging curves participating in the determination of the model; parsing, recording and storing the expression of the well logging response equation; establishing a target function of an optimization problem according to the parsed response equation expression, and solving the target function through an iteration algorithm to determine an optimal component content of the stratum to be studied.

In one embodiment, the processor performs the following operations: parsing expression of the well logging response equation, and translating into a postfix expression that can be used for calculation in computer; recording and storing each element in the postfix expression using a dynamic array storage structure through a data structure; traversing the storage structures of the postfix expression, determining combination relations between each element in a derivation rule, and determining partial derivative forms of the postfix expression.

In one embodiment, the processor performs the following operations: converting the target function into an expression of the unconstrained problem using a penalty function method:

$$\min \Phi(\vec{v},M)=F(\vec{v})+M \cdot P(\vec{v})$$

wherein M denotes a penalty factor;

$$P(\vec{v}) = \sum_{K=1}^{cn} [\max(0, h_k(\vec{v}))]^2$$

denotes a penalty function, wherein when $\vec{v}$ satisfies a constraint condition $h_k(\vec{v}) \leq 0$, a penalty term $M \cdot P(\vec{v})=0$, and when $\vec{v}$ does not satisfy the constraint condition $h_k(\vec{v}) \leq 0$, the penalty term $M \cdot P(\vec{v}) > 0$ and increases with the increase of M; cn denotes the number of the constraint conditions.

In one embodiment, the processor performs the following operations: determining an iteration increment through the Levenberg-Marquardt algorithm as follows:

$$(J^T J + \mu \cdot I) \cdot h = -J^T R$$

wherein J denotes a Jacobi matrix of R; I denotes a unit matrix; and μ denotes a damping factor, $$R = \begin{bmatrix} (t_{ci} - t_{mi}) \cdot w_i \\ (g_k - b_k) \cdot \alpha_k \end{bmatrix}.$$

In one embodiment, the processor performs the following operations: performing a first iteration on a group of initially set stratum component content values for a each processed depth point, plugging each stratum component content value into a partial derivative expression parsed and stored to obtain a matrix J; acquiring a current iteration increment according to the iteration increment, and turning to a next iteration; and obtaining an optimal stratum component content when an iteration stratum component value satisfies a precision requirement and the additional constraint condition.

The above specific embodiments clearly and completely describe the technical solutions of the present invention, but they are just parts, rather than all, of the embodiments. Based on the embodiments of the present invention, any other embodiment obtained by a person skilled in the art without paying any creative effort shall fall within the protection scope of the present invention.

The invention claimed is:

1. A stratum component optimization determining method, wherein comprising:
   establishing a stratum rock component model according to core analysis data and geological conditions of a stratum to be studied, and determining well logging curves participating in the determination of the model;
   determining an expression of a well logging response equation corresponding to the well logging curves participating in the determination of the model;
   parsing, recording and storing the expression of the well logging response equation;
   establishing a target function of an optimization problem according to the parsed response equation expression, and solving the target function through an iteration algorithm to determine an optimal component content of the stratum to be studied, wherein the target function of the optimization problem is:

$$v^* = \mathrm{argmin}\{F(\vec{v})\}$$
   $$F(\vec{v}) = \frac{1}{2}\sum_{K=1}^{n}[(t_{ci} - t_{mi}) \cdot w_i]^2$$

wherein $F(\vec{v})$ denotes the target function; $v^*$ denotes a value that makes the target function a minimum value; $t_{ci}$ denotes a value of response equation each well logging method determined according to the well logging response equation; $t_{mi}$ denotes an actual well logging measured response value; $w_i$ denotes a weight coefficient of the well logging curve in an optimization model; and n denotes the number of well logging curves solved.

2. The method according to claim 1, wherein each well logging curve comprises at least one of a natural gamma well logging curve, a deep lateral resistivity well logging curve, a shallow lateral resistivity well logging curve, a density well logging curve, a neutron well logging curve or an element capture energy spectrum well logging curve.

3. The method according to claim 1, wherein the parsing, recording and storing the well logging response equation expression comprises:
   parsing the expression of the well logging response equation, and translating the expression of the well logging response equation into a postfix expression that can be used for calculation in a computer;
   recording and storing each element in the postfix expression using a dynamic array storage structure;
   traversing the storage structures of the postfix expression, determining combination relations between each element in a derivation rule, and determining partial derivative forms of the postfix expression.

4. The method according to claim 2, wherein the well logging response equation is:

$$t_{ci} = f_i(\vec{v})$$

wherein $t_{ci}$ denotes a value of the well logging response equation; $\vec{v}$ denotes the content of the mineral and fluid component in the stratum to be studied; $f_i(\vec{v})$ denotes an expression form of the well logging response equation, including variables, constants, operators and parameter symbols of stratum mineral and fluid component.

5. The method according to claim 1, wherein the stratum rock component model further comprises a constraint condition comprising:

$$h_k(\vec{v}) = C_k \cdot \vec{v} - b_k \leq 0$$

wherein, $h_k(\vec{v})$ denotes a constraint condition; $C_k$ denotes a coefficient matrix of the constraint condition; $\vec{v}$ denotes the contents of stratum mineral and fluid component in the stratum to be studied; $b_k$ denotes a constraint condition boundary.

6. The method according to claim 5, wherein solving the target function through an iteration algorithm comprises:
   converting the target function into an expression of an unconstrained problem using a penalty function method:

$$\min \Phi(\vec{v}, M) = F(\vec{v}) + M \cdot P(\vec{v})$$

wherein M denotes a penalty factor;

$$P(\vec{v}) = \sum_{K=1}^{cn}[\max(0, h_k(\vec{v}))]^2$$

denotes a penalty function, wherein when $\vec{v}$ satisfies $h_k(\vec{v}) \leq 0$, a penalty term $M \cdot P(\vec{v}) = 0$, and when $\vec{v}$ does not satisfy $h_k(\vec{v}) \leq 0$, the penalty term $M \cdot P(\vec{v}) > 0$ and increases with the increase of M; cn denotes the number of the constraint conditions.

7. The method according to claim 6, wherein solving the target function through an iteration algorithm further comprises:
   determining an iteration increment through a Levenberg-Marquardt algorithm as follows:

$$(J^T J + \mu \cdot I) \cdot h = -J^T R$$

wherein J denotes a Jacobi matrix of R; I denotes a unit matrix; h denotes a displacement vector; μ denotes a damping factor; and $$R = \begin{bmatrix} (t_{ci} - t_{mi}) \cdot w_i \\ (g_k - b_k) \cdot \alpha_k \end{bmatrix},$$

in which $g_k = C_k \cdot \vec{v}$.

8. The method according to claim 7, wherein solving the target function through an iteration algorithm further comprises:
   performing a first iteration on a group of initially set stratum component content values for each processed depth point, plugging each stratum component content value into a partial derivative expression parsed and stored to obtain a matrix J;
   acquiring a current iteration increment according to the iteration increment, and turning to a next iteration;
   obtaining the optimal stratum component content by solving when an iteration stratum component value satisfies a precision requirement and the additional constraint condition.

9. A stratum component optimization determining device, comprising a memory, a processor and a computer program stored in the memory and executable on the processor, wherein the processor performs the following operations when executing the computer program:

establishing a stratum rock component model according to core analysis data and geological conditions of a stratum to be studied, and determining well logging curves participating in the determination of the model;

determining an expression of the well logging response equation corresponding to the well logging curves participating in the determination of the model;

parsing, recording and storing the expression of the well logging response equation; and establishing a target function of an optimization problem according to the parsed response equation expression, and solving the target function through an iteration algorithm to determine an optimal component content of the stratum to be studied, wherein the target function of the optimization problem is:

$$v^* = \operatorname{argmin}\{F(\vec{v})\}$$

$$F(\vec{v}) = \frac{1}{2}\sum_{K=1}^{n}[(t_{ci} - t_{mi}) \cdot w_i]^2$$

wherein $F(\vec{v})$ denotes the target function; $v^*$ denotes a value that makes the target function a minimum value; $t_{ci}$ denotes a value of response equation each well logging method determined according to the well logging response equation; $t_{mi}$ denotes an actual well logging measured response value; $w_i$ denotes a weight coefficient of the well logging curve in an optimization model; and n denotes the number of well logging curves solved.

10. A non-transitory computer readable storage medium, wherein the non-transitory computer readable storage medium stores a computer program which causes a processor to perform the following operations when executed:

establishing a stratum rock component model according to core analysis data and geological conditions of a stratum to be studied, and determining well logging curves participating in the determination of the model;

determining an expression of the well logging response equation corresponding to the well logging curves participating in the determination of the model;

parsing, recording and storing the expression of the well logging response equation;

establishing a target function of an optimization problem according to the parsed response equation expression, and solving the target function through an iteration algorithm to determine an optimal component content of the stratum to be studied, wherein the target function of the optimization problem is:

$$v^* = \operatorname{argmin}\{F(\vec{v})\}$$

$$F(\vec{v}) = \frac{1}{2}\sum_{K=1}^{n}[(t_{ci} - t_{mi}) \cdot w_i]^2$$

wherein $F(\vec{v})$ denotes the target function; $v^*$ denotes a value that makes the target function a minimum value; $t_{ci}$ denotes a value of response equation each well logging method determined according to the well logging response equation; $t_{mi}$ denotes an actual well logging measured response value; $w_i$ denotes a weight coefficient of the well logging curve in an optimization model; and n denotes the number of well logging curves solved.

* * * * *